(12) United States Patent
Thayer

(10) Patent No.: US 8,886,892 B2
(45) Date of Patent: Nov. 11, 2014

(54) MEMORY MODULE AND METHOD EMPLOYING A MULTIPLEXER TO REPLACE A MEMORY DEVICE

(75) Inventor: Larry J. Thayer, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1523 days.

(21) Appl. No.: 11/627,469

(22) Filed: Jan. 26, 2007

(65) Prior Publication Data

US 2008/0181021 A1    Jul. 31, 2008

(51) Int. Cl.
*G06F 12/00* (2006.01)
*G11C 7/00* (2006.01)
*G11C 8/00* (2006.01)
*G11C 5/06* (2006.01)

(52) U.S. Cl.
CPC ........................................ *G11C 5/066* (2013.01)
USPC .............. 711/154; 711/E12.001; 365/189.02; 365/189.05

(58) Field of Classification Search
USPC .......................... 365/189.02, 189.05; 711/154
See application file for complete search history.

(56) References Cited

U.S. PATENT DOCUMENTS

| | | | |
|---|---|---|---|
| 4,093,985 A | 6/1978 | Das | |
| 4,345,319 A | 8/1982 | Bernardini et al. | |
| 4,475,189 A * | 10/1984 | Herr et al. | 370/261 |
| 4,481,578 A * | 11/1984 | Hughes et al. | 709/212 |
| 4,817,056 A * | 3/1989 | Furutani et al. | 365/200 |
| 5,777,935 A * | 7/1998 | Pantelakis et al. | 365/203 |
| 5,859,960 A * | 1/1999 | Kurihara et al. | 714/7 |
| 5,970,013 A | 10/1999 | Fischer et al. | |
| 6,011,733 A | 1/2000 | Fischer et al. | |
| 6,201,740 B1 * | 3/2001 | Seyyedy et al. | 365/189.19 |
| 6,233,181 B1 * | 5/2001 | Hidaka | 365/200 |
| 6,438,672 B1 | 8/2002 | Fischer et al. | |
| 6,567,950 B1 * | 5/2003 | Bertin et al. | 714/767 |
| 6,785,143 B2 | 8/2004 | Nakaoka | |
| 6,857,065 B2 * | 2/2005 | Blaner et al. | 713/1 |
| 7,599,205 B2 * | 10/2009 | Rajan | 365/63 |
| 2004/0017664 A1 | 1/2004 | Nakaoka | |
| 2005/0259504 A1 * | 11/2005 | Murtagh et al. | 365/233 |
| 2006/0039672 A1 * | 2/2006 | Yamada et al. | 386/46 |
| 2006/0053361 A1 * | 3/2006 | Kim | 714/766 |
| 2006/0179362 A1 | 8/2006 | Alves et al. | |
| 2006/0218451 A1 | 9/2006 | Abe | |
| 2006/0248392 A1 | 11/2006 | Barlow et al. | |
| 2007/0058471 A1 * | 3/2007 | Rajan et al. | 365/222 |

* cited by examiner

*Primary Examiner* — D. J. Bernard

(57) ABSTRACT

A memory module including memory devices, a spare memory device, a multiplexing unit, and a memory buffer is provided. The multiplexing unit is coupled with each of the memory devices and the spare memory device, while the memory buffer is coupled with the multiplexing unit. The memory buffer includes a serial interface over which commands are received from a memory controller. The memory buffer is configured to process the commands and provide the memory controller access to the memory device through the multiplexing unit in response to the commands. Also, in response to at least one of the commands, the memory buffer is configured to direct the multiplexing unit to couple the spare memory device to the memory buffer in place of one of the memory devices for at least a next access of the memory devices.

20 Claims, 10 Drawing Sheets

MEMORY MODULE AND METHOD EMPLOYING A MULTIPLEXER TO REPLACE A MEMORY DEVICE

BACKGROUND

Dual in-line memory modules (DIMMs) have long been a popular form of digital memory for computing systems due to their high availability and adherence to form factor and electrical interface standards. Typically, a DIMM employs multiple memory devices, such as dynamic random access memories (DRAMs), residing on a single, small printed circuit board (PCB) to provide a large amount of memory to a processing system, such as a desktop computer, a network server, or other similar computing system. On DIMMs, memory devices are populated on both faces of the PCB, while single in-line memory modules (SIMMs) contain memory devices on only one side of the PCB. Oftentimes, the memory devices are logically organized into one or more "ranks," or separately addressable areas of memory. Further, each memory device associated with a particular rank contains a specific range of bits of each addressable location of the memory; thus, the bit width of each addressable location is normally directly related to the number of memory devices employed in the rank.

Each DIMM is typically coupled to a memory controller on a processing system motherboard by way of a connector so that the DIMM may be easily replaced in the event the DIMM becomes defective. Replacement may also occur in order to upgrade the capacity or speed of the DIMM. Typically, the motherboard provides several DIMM connectors to allow a range of memory capacities to present the customer a choice in price-performance tradeoffs.

As the speed and performance capabilities of processors used within computing platforms have continued to increase, commensurate enhancements in memory technology have created significant implementation issues. For example, increased memory capacities of DIMMs require more input/output (I/O) signals, such as address and data signals, between each DIMM and the motherboard, worsening a pre-existing I/O signal routing problem. Also, higher DIMM access speeds have decreased the number of DIMMs that may be coupled to a memory controller due to the transmission line "stubs" created on the address and data signal lines between the controller and the DIMMs.

To address these problems, fully-buffered dual in-line memory modules (FB-DIMMs) have been devised. Each FB-DIMM includes a number of memory devices, such as DRAMs, plus an advanced memory buffer (AMB) for coupling the DRAMs with the memory controller. Instead of coupling the memory controller directly with each of the DIMMs, the memory controller is coupled by way of two unidirectional serial command and data interfaces with a first of the DIMMs. That DIMM is coupled with the next DIMM in a similar fashion, resulting in a point-to-point serial interface connecting the controller and DIMMs in a chain-like fashion. As a result, the use of the serial interfaces simultaneously resolves the signal routing problem and the transmission line maladies of prior DIMMs. Thus, more DIMMs may be coupled with any one memory controller, thus facilitating significant increases in memory capacity while also allowing faster memory access times.

However, FB-DIMM technology does not address the growing problem of increased DRAM failure rates associated with the DRAM speed and capacity advances mentioned above. To deal with this issue, memory controllers driving traditional DIMM systems and more recent FB-DIMM systems employ redundancy data, such as error correction codes (ECC) or cyclic redundancy check (CRC) codes, stored within one or more extra DRAMs of a DIMM to correct data errors. While some of these errors are transient or temporary in nature, others may be indicative of a failing DRAM. To address a defective DRAM, the memory controller may use one of the extra DRAMs of both traditional DIMMs and FB-DIMMs as a spare so that the memory controller may map the contents of a failing DRAM to the spare DRAM, thus removing the failing DRAM from service without requiring replacement of the DIMM. However, with DRAM failure rates continuing to increase, one spare DRAM per DIMM may not be enough to allow replacement of the DIMM before a second DRAM fails, thus causing a complete failure of the DIMM. Further, even if two or more spare DRAMs are provided, current memory controllers typically are not equipped to utilize those spares effectively. In addition, when employing an extra DRAM as a spare, the error correction capability of the memory controller is reduced, since less storage is available for the error correction data as a result.

DETAILED DESCRIPTION

Figure 1:
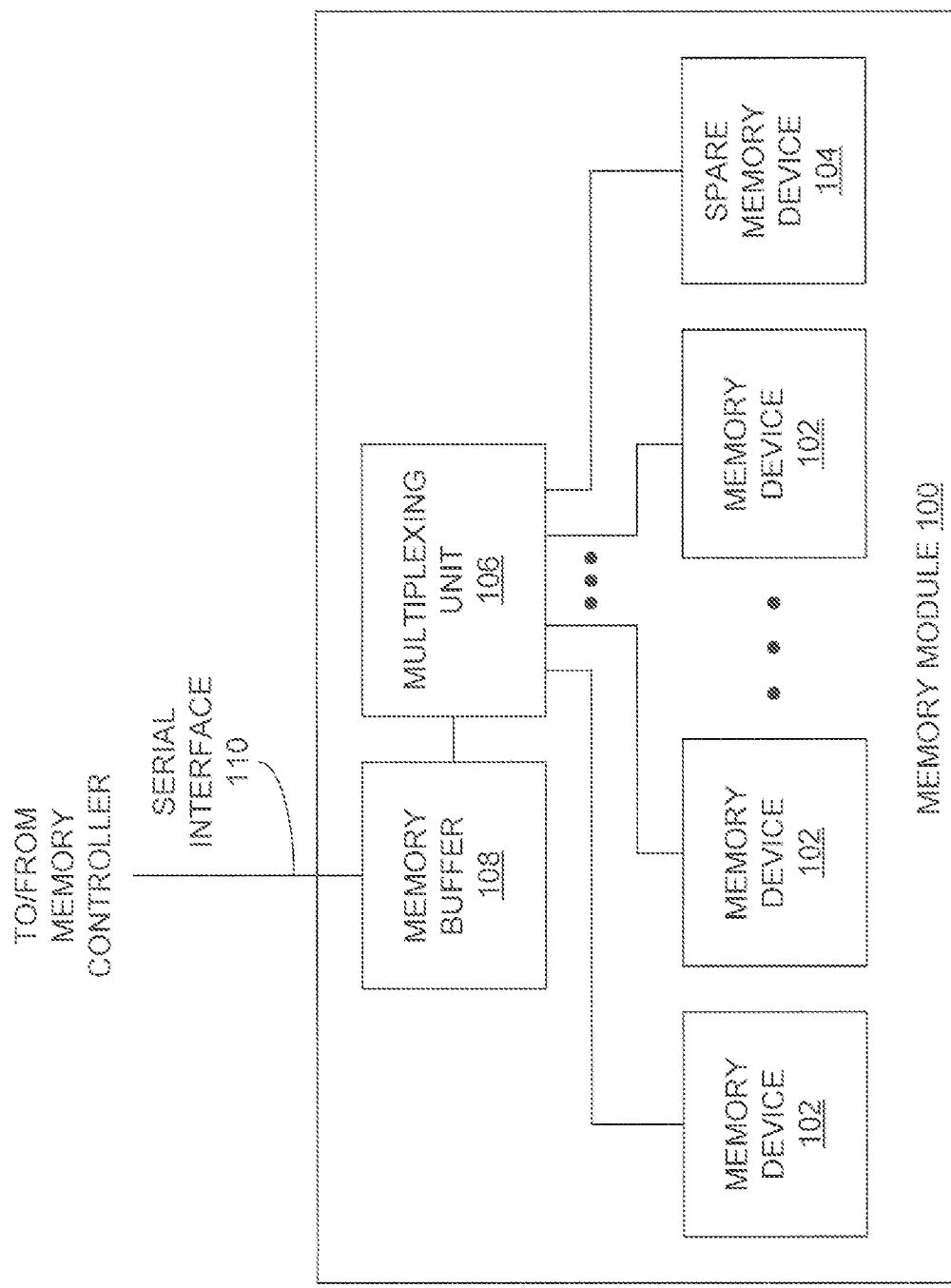
FIG. 1 is a block diagram of a memory module according to an embodiment of the invention.

FIG. 1 illustrates a memory module 100 according to one embodiment of the invention. The module 100 includes memory devices 102 and a spare memory device 104, each of which is coupled with a multiplexing unit 106. Also included is a memory buffer 108 coupled with the multiplexing unit 106. The memory buffer 108 contains a serial interface 110 over which the memory buffer 108 is configured to receive commands from a memory controller. The memory buffer 108 is further configured to process the commands received and provide the memory controller access to the memory devices 102 in response to the commands. In response to at least one of the commands, the memory buffer 108 is configured to direct the multiplexing unit 106 to couple the spare memory device 104 to the memory buffer 108 in place of one of the memory devices for at least a next access of the memory devices 102.

Figure 2:
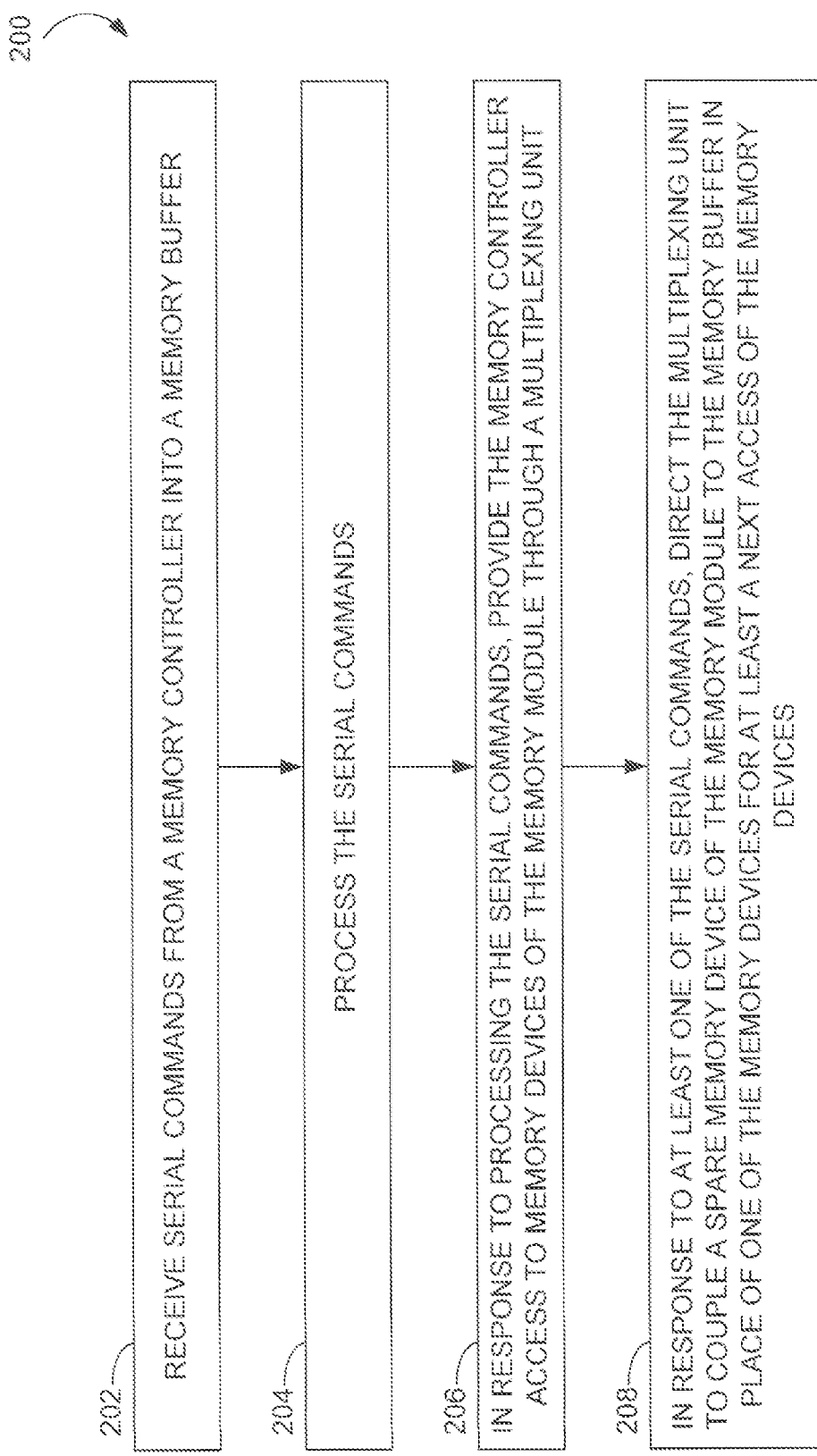
FIG. 2 is a flow diagram of a method for operating a memory buffer of a memory module according to an embodiment of the invention.

Another embodiment is illustrated in the flow diagram of FIG. 2. The depicted method 200 for operating a memory buffer of a memory module, such as the memory buffer 108 shown in FIG. 1, includes receiving serial commands from a memory controller (operation 202). The received serial commands are processed (operation 204). In response to processing the serial commands, access to memory devices of the memory module is provided to the memory controller through a multiplexing unit (operation 206). Further, in response to at least one of the serial commands, the multiplexing unit is directed to couple a spare memory device of the memory module to the memory buffer in place of one of the memory devices for at least a next access of the memory devices (operation 208).

Figure 3:
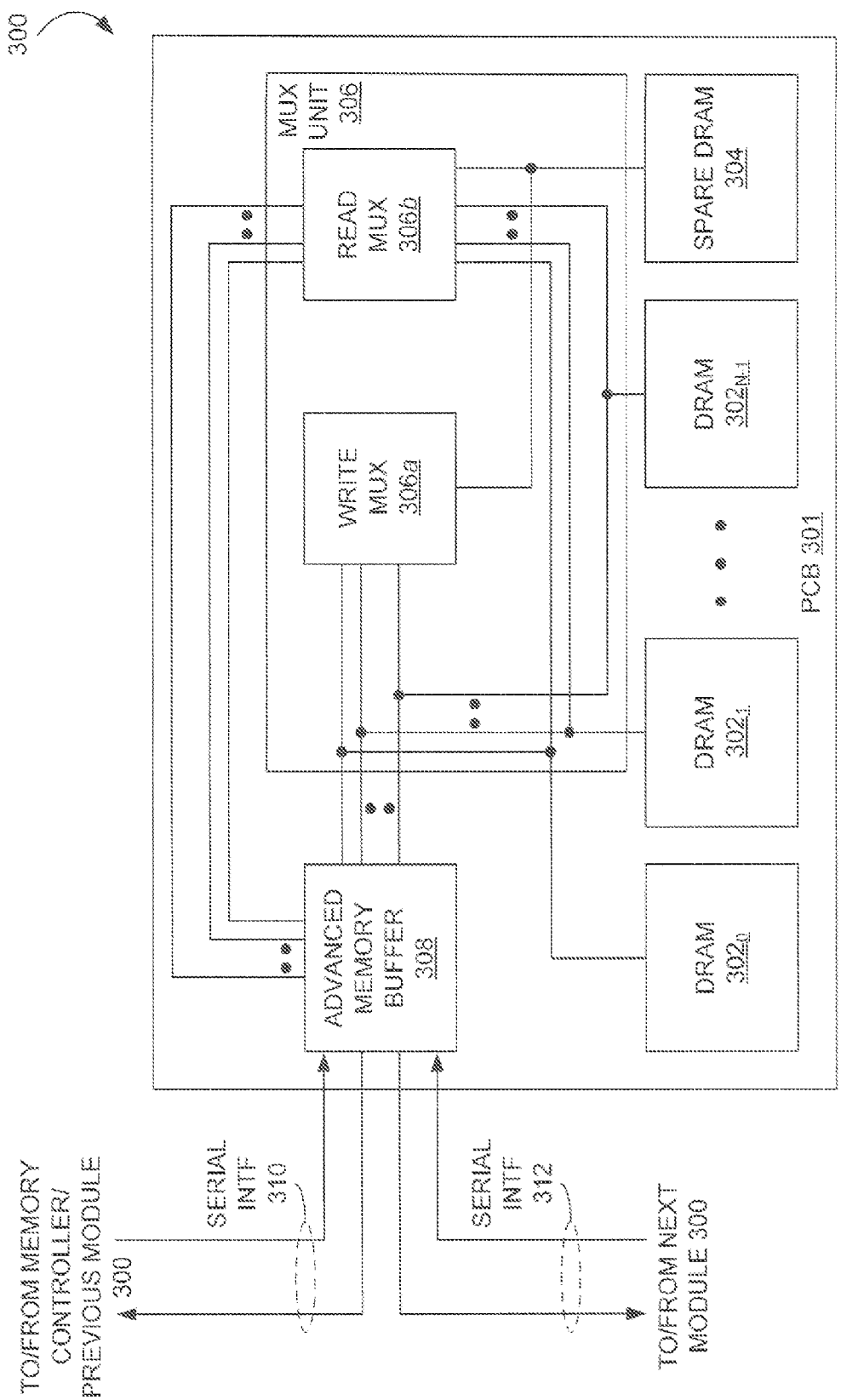
FIG. 3 is a simplified block diagram of a fully-buffered dual in-line memory module according to an embodiment of the invention.

Another example of a memory module 300 according to another embodiment of the invention is depicted in FIG. 3. This particular memory module 300 is based upon the FB-DIMM architecture generally discussed above. While an FB-DIMM-related architecture is the focus of the discussion related to FIGS. 3 and 4, other types of memory modules exhibiting diverse logical and physical structures may benefit from various aspects of the invention as described below.

The module 300 includes a printed circuit board (PCB) 301 upon which the other devices discussed below are mounted, and through which the devices are interconnected. Other components, such as decoupling and bypass capacitors, may also be included but not explicitly shown in FIG. 3 to promote brevity in the following discussion. Connections between the PCB 301 and memory controller or other memory modules 300 may be facilitated by way of edge contacts formed to make electrical connections with corresponding pins of a standard FB-DIMM connector. In other embodiments, various other types of connection schemes may be employed.

Coupled to the PCB 301 are several DRAMs 302 numbered $302_0$ through $302_{N-1}$ employed as memory devices for storing data, such as user data, program data, and the like. Each of the DRAMs 302 provides multiple addressable memory locations, wherein each location is of a bit-width provided by the DRAM 302. In one example, the corresponding addressable location of each DRAM 302 is configured to be accessed in parallel, resulting in a logical word at each addressable location having a width equal to the number of DRAMs 302 times the bit-width of each DRAM 302. In one embodiment, each of the DRAMs 302 has a bit-width of four. In another example, each DRAM 302 is eight bits wide. Other bit widths are possible in various implementations.

In one embodiment, the number of DRAMs 302 coincides with a number of DRAMs commonly associated with an FB-DIMM. For example, if eight-bit DRAMs 302 are employed, nine DRAMs 302 may populate the PCB 301. In many cases, eight of the DRAMs 302 would hold the data to be stored on the module, while one of the DRAMs 302 would hold error correction data, such as Reed-Solomon ECC data. In that example, each addressable location associated with the module 300 would hold 64 bits of data and 8 bits of error correction data to correct the data. Under a commonly-held rule that an n-bit error requires 2n bits to correct, this scheme would not be capable of always correct a failing DRAM 302. In another embodiment employing 4-bit DRAMs 302, eighteen DRAMs 302 may be present in the module 300. In that case, sixteen DRAMs 302 may be used for data, while the two remaining DRAMs 302 contain the error correction data, resulting in each addressable word containing 64 bits of data and 8 bits of associated error correction data, as was the case with the 8-bit DRAMs 302 discussed above. However, since 8 bits of error correction data are available, and each DRAM 302 is four bits wide, such an error correction scheme may indeed be capable of correcting an entire DRAM 302.

Also included in the module 300 is a spare DRAM 304 configured to replace one of the DRAMs 302 in case of DRAM failure. The use of the spare DRAM 302 is discussed in greater detail in the discussion provided below.

Coupled with each of the DRAMs 302 and the spare DRAM 304 is a multiplexing unit 306, which in turn is coupled with an advanced memory buffer (AMB) 308, which operates in a fashion similar to AMBs of previous FB-DIMMs. While the specific embodiment of the FIG. 3 displays the AMB 308 and the multiplexing unit 306 as separate entities, such as separate integrated circuits (ICs), the AMB 308 and the multiplexing unit 306 may be combined within a single IC, thus saving space on the PCB 301. In another embodiment, the AMB 308, possibly along with the multiplexing unit 306, may reside on a separate printed circuit board, such as a motherboard to which the PCB 301 is coupled, thus saving space on the PCB 301. In this case, the memory module 300 would include circuitry residing on the PCB 301 and elsewhere.

In the particular example of FIG. 3, the multiplexing unit 306 includes a write multiplexer 306a for multiplexing DRAM data signals from the AMB 308 to the spare DRAM 304. More specifically, data intended for any one of the DRAMs 302 may be directed to the spare DRAM 304. Using a module implementing four-bit DRAMs 302, as described above, data to be written to any one of the eighteen DRAMs 302 (N DRAMs 302 in the general case) may instead be written to the spare DRAM 304, depending on the actions of the AMB 308 in controlling the write multiplexer 306a, as discussed more fully below.

Figure 4:
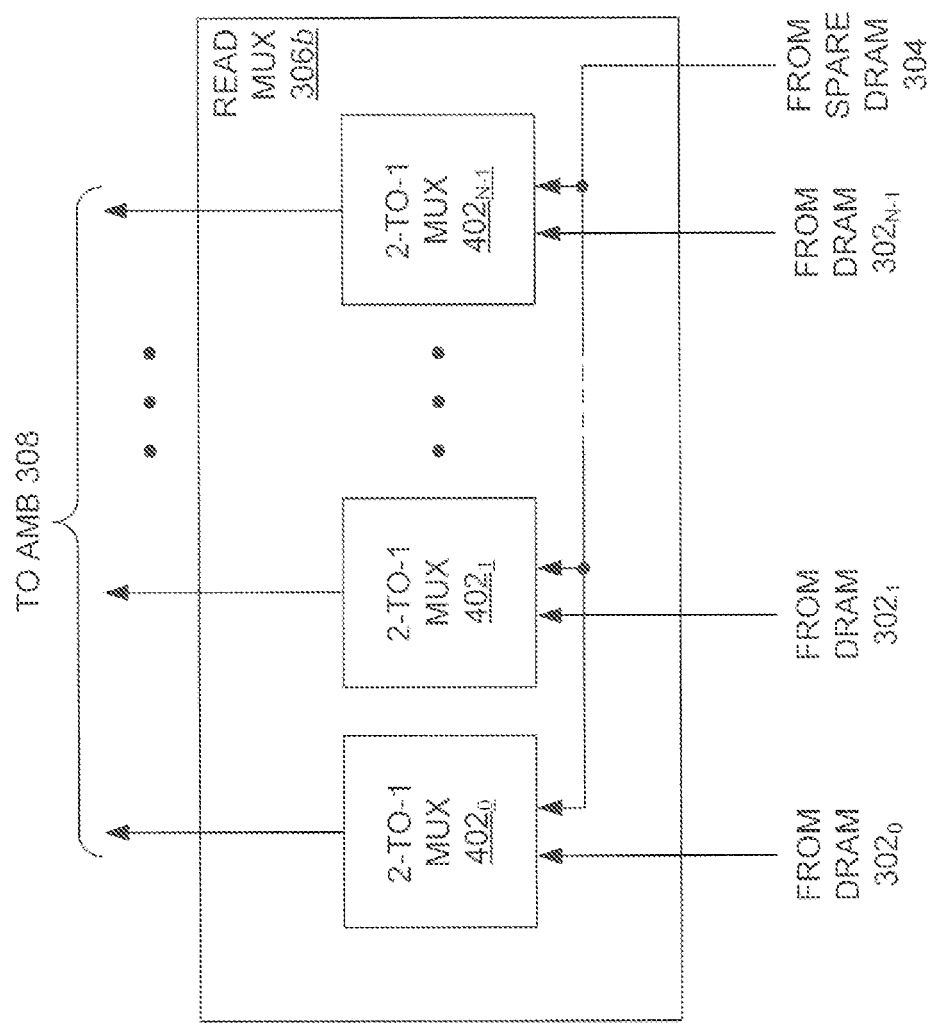
FIG. 4 is a block diagram of a read multiplexer of the memory module of FIG. 3.

Also included in the multiplexing unit 306 is a read multiplexer 306b. Acting in a converse manner to the write multiplexer 306a, the read multiplexer 306b, under the direction of the AMB 308, may direct read data from the spare DRAM 304 to replace the read data from any one of the DRAMs 302. FIG. 4 provides one example of the read multiplexer 306b, in which N 2-to-1 multiplexers 402, labeled $402_0$ to $402_{N-1}$, may be employed. More specifically, each multiplexer 402 includes two inputs, with each input having a bit-width equal to the bit-width of each DRAM 302 and the spare DRAM 304. One input of each 2-to-1 multiplexer 402 is coupled to one of the DRAMs 302, while the other input is coupled with the spare DRAM 304. Thus, the read data from the spare DRAM 304 can replace the corresponding data of any one of the DRAMs 302 as directed by the AMB 308.

Returning to FIG. 3, the AMB 308 is configured to control the operation of the multiplexer unit 306, which is done by way of commands received over a serial interface 310 coupled with a memory controller (not shown in FIG. 3). As with typical FB-DIMMs, the serial interface 310 may be coupled with the memory controller by way of another intervening memory module 300. Further, the memory module 300 of FIG. 3 may also be coupled to another memory module 300 by way of a second serial interface 312, thus passing through commands received from the memory controller intended for the next memory controller 300.

Generally, the AMB 308 is configured to receive commands from the memory controller, process the commands, and provide the memory controller access to the memory stored in the DRAMs 302, and possibly the spare DRAM 304, in response to processing the commands. More specifically, one command may instruct the memory buffer to read data from one or more addressable memory locations of the DRAMs 302 and return the data to the memory controller. Similarly, another command, accompanied by specific data, may instruct the AMB 308 to write the specific data to one or more addressable locations of the DRAMs 302 for storage and later retrieval.

While issuing these commands to the AMB 308, the memory controller may detect and correct errors in the stored data in the memory module 300 by way of the error correction data stored therein, as described earlier. Many of these errors may be temporary in nature, and thus may repaired by determining the correct data by way of the error correction data and rewriting the correct data to the proper addressable location within the DRAMs 302 of the memory module.

At some point, however, the memory controller may determine that one of the DRAMs 302 exhibits an uncharacteristically high number of data errors, indicating that partial or complete failure of the DRAM 302 may be imminent. In response, the memory controller may unconditionally correct, or "erase," the data residing in the defective DRAM 302 after reading the data at the corresponding addressable location. In other words, the memory controller may assume that the data stored within the defective DRAM 302 is erroneous, ignore it, and then regenerate it using the error correction data. This erasure expedites the correction of data and enhances the possibility of correcting additional data errors. Unfortunately, when erasure of one DRAM 302 is undertaken, correcting another failing DRAM 302 typically is impossible.

Figure 5:
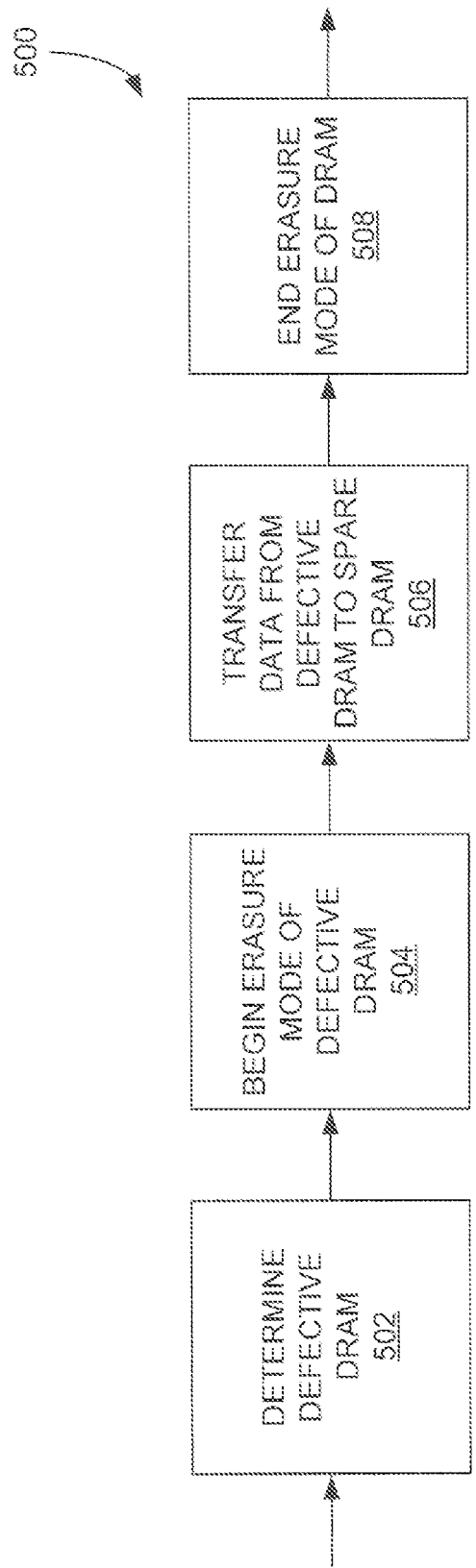
FIG. 5 is a flow diagram of a method of operating a memory controller in response to detecting a failing memory device of a memory module coupled with the controller according to an embodiment of the invention.

To enhance the ability of the memory controller to detect and correct data errors in the presence of a failed DRAM 302, the spare DRAM 304 of the memory module 300 may be utilized to take the place of the failed DRAM 302 and restore the full corrective power of the error correction scheme employed by the memory controller. FIG. 5 provides a flow diagram of one possible method that the memory controller could implement using the memory module 300 for replacing a defective DRAM 302. After the memory controller determines that a particular DRAM 302 is defective (operation 502), the memory controller begins erasure mode of the defective DRAM 302 (operation 504), as indicated above.

Further, the memory controller may then transfer a corrected version of the data residing within the defective DRAM 302 to the spare DRAM 304 (operation 506). More specifically, the memory controller may read the data at each addressable location of the defective DRAM 302, correct that data, and then rewrite the data to the spare DRAM 304. In one embodiment, the memory controller performs the transfer operation 506 as a background task while other read and write operations are taking place.

Figure 6:
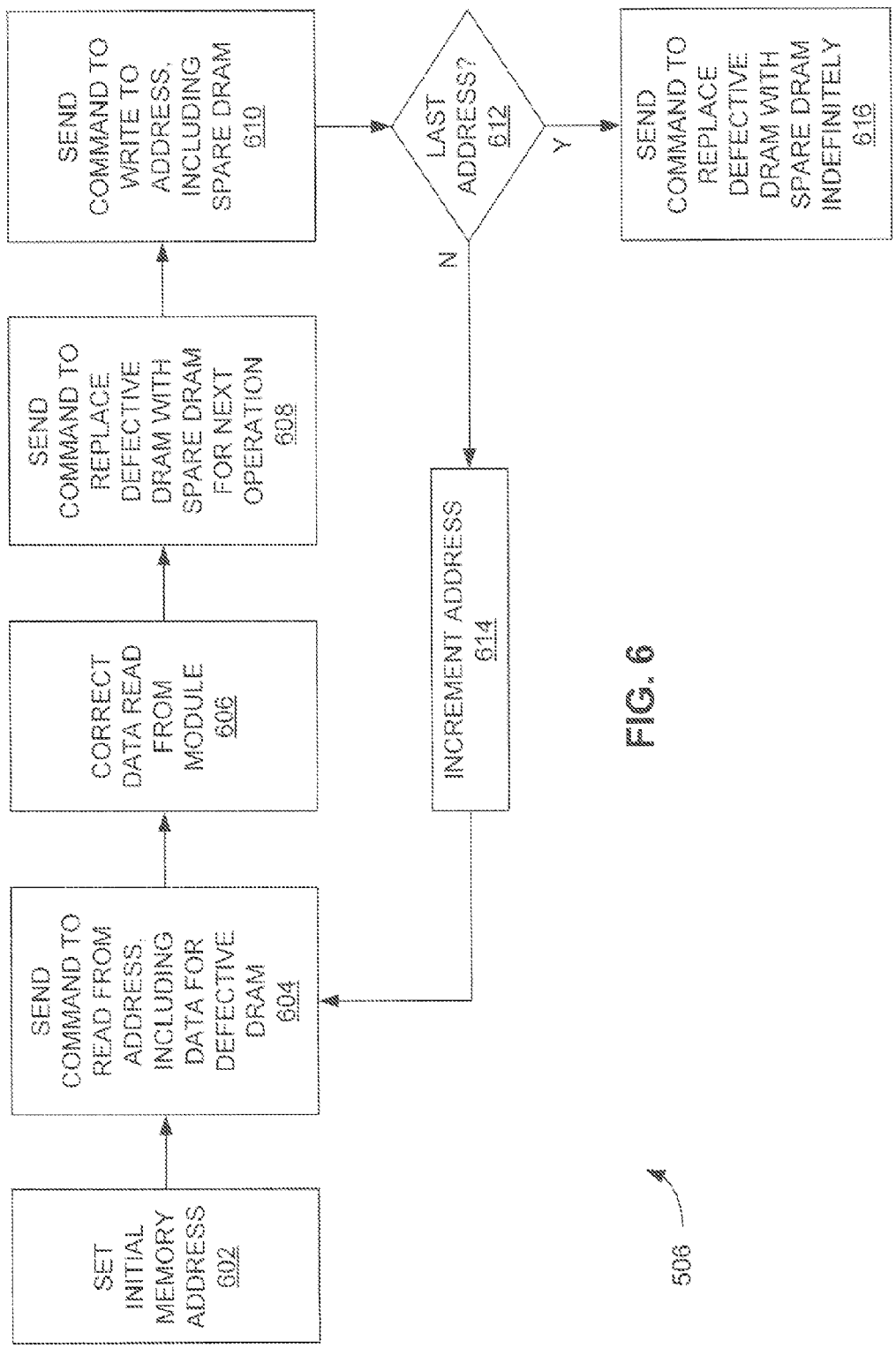
FIG. 6 is a flow diagram of a method incorporated within the method of FIG. 6 for transferring data from the failing memory device to a spare memory device of the memory module according to an embodiment of the invention.

FIG. 6 provides a flow diagram describing a possible embodiment of the transfer operation 506 in greater detail as performed by the memory controller. For example, the memory controller may set an initial memory address within the memory module 300 at which the transfer operation is to begin (operation 602). Often, this address would be the lowest numerical address of any addressable location of the module 300, although any other address of the module 300 may be utilized as the initial address. The memory controller may then issue a command to the AMB 308 of the module 300 to read the data at the selected address from the DRAMs 302, including the defective DRAM 302 (operation 604). After the memory controller receives the data, the memory controller then corrects the data, possibly by way of the erasure procedure described above (operation 606).

The memory controller may then issue another command directing the AMB 308 to replace the defective DRAM 302 with the spare DRAM 304 for the next operation requested (operation 608). Thereafter, the memory controller may issue a write command with the corrected data to the AMB 308 to cause the data to be written to the DRAMs 302, with the data associated with the defective DRAM 302 being stored in the spare DRAM 304 by way of the write multiplexer 306a (operation 610). As a result, a corrected version of the data within the defective DRAM 302 for that particular addressable location within the module 300 is transferred to the spare DRAM 304. Thereafter, if the data residing within the last address of the module 300 has not yet been transferred (operation 612), the address may be incremented or otherwise modified (operation 614), and the data at the new address is read for subsequent transfer (operation 602). Otherwise, the transfer operation 506 is complete.

With the data within the defective DRAM 302 being successfully transferred to the spare DRAM 304, all future read and write accesses to the memory module 300 involve the use of the spare DRAM 304 in place of the defective DRAM 302. To this end, in one embodiment the memory controller may issue another command to instruct the AMB 308 to direct the multiplexing unit 306 to direct all subsequent read and write data previously involving the defective DRAM 302 to or from the spare DRAM 304 indefinitely (operation 616). Thus, once the replacement has been completed, this embodiment does not require repeated commands directing the AMB 308 to continue the replacement, thereby reducing the amount of communication overhead otherwise experienced.

Returning to the method 500 of FIG. 5, once the transfer operation 506 is complete, the memory controller may end the erasure of the defective DRAM 302 (operation 508), thus allowing all of the error correction data to be utilized at its full capacity to correct other data errors encountered, hence allowing the erasure of a second defective DRAM 302 within the memory module 300.

Figure 7:
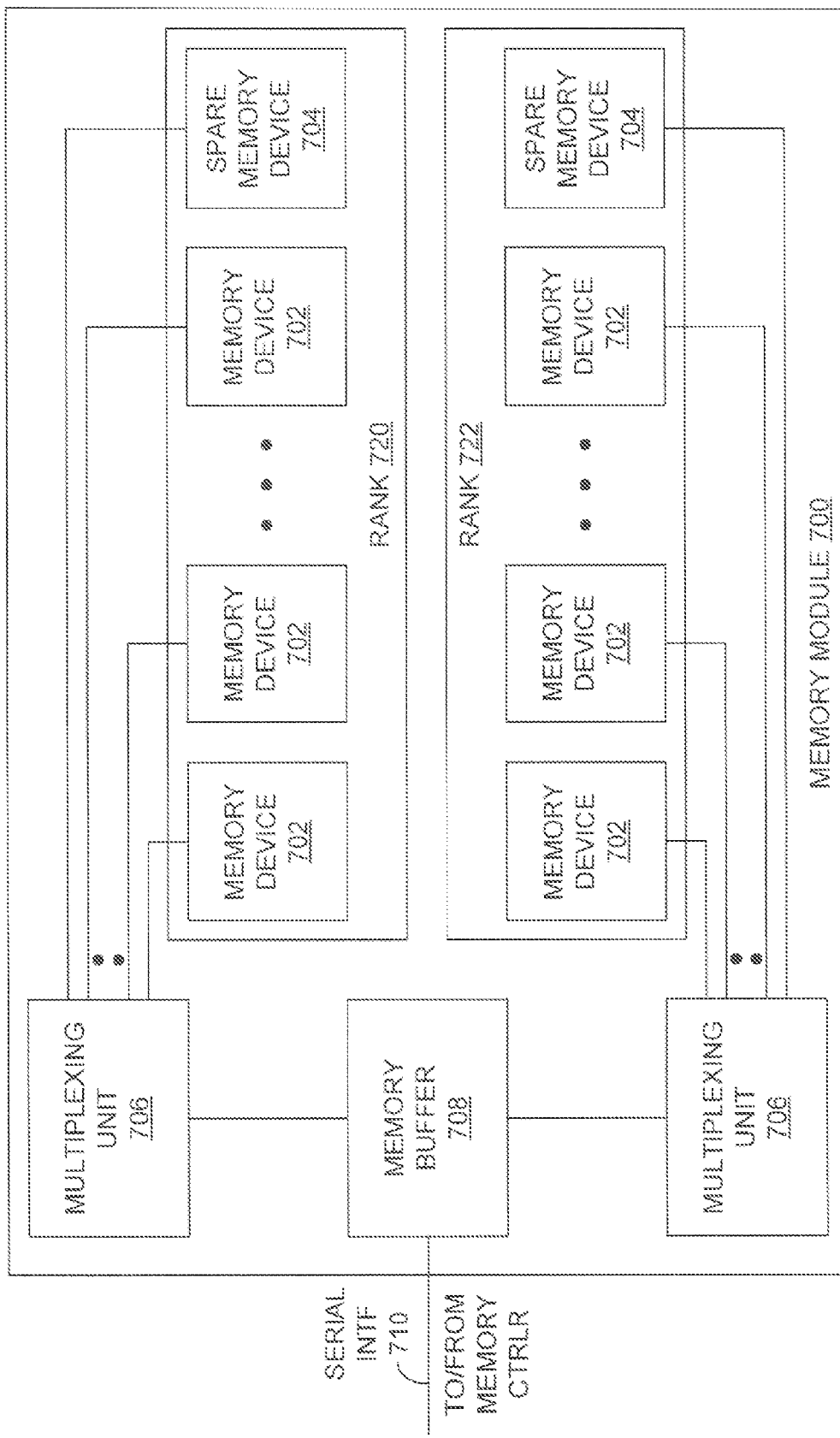
FIG. 7 is a block diagram of a memory module according to another embodiment of the invention in which two memory ranks are provided.

The embodiment of FIG. 3 is one example of a memory module 300 possessing a single rank of memory devices, wherein all of the devices are combined to provide a single addressable memory area. FIG. 7 presents an example of a memory module 700 containing two ranks 720, 722, each of which contains several memory devices 702 and a spare memory device 704. Each rank 720, 722 is coupled with its own multiplexing unit 706, through which a memory buffer 708 may perform read and write operations with the ranks 720, 722. As before, the memory buffer 708 may receive commands originating from a memory controller over a serial interface 710. Given this memory configuration, two separate defective memory devices 702, one per rank 720, 722, may be replaced by the spare memory devices 704 as in the manner described above.

Figure 8:
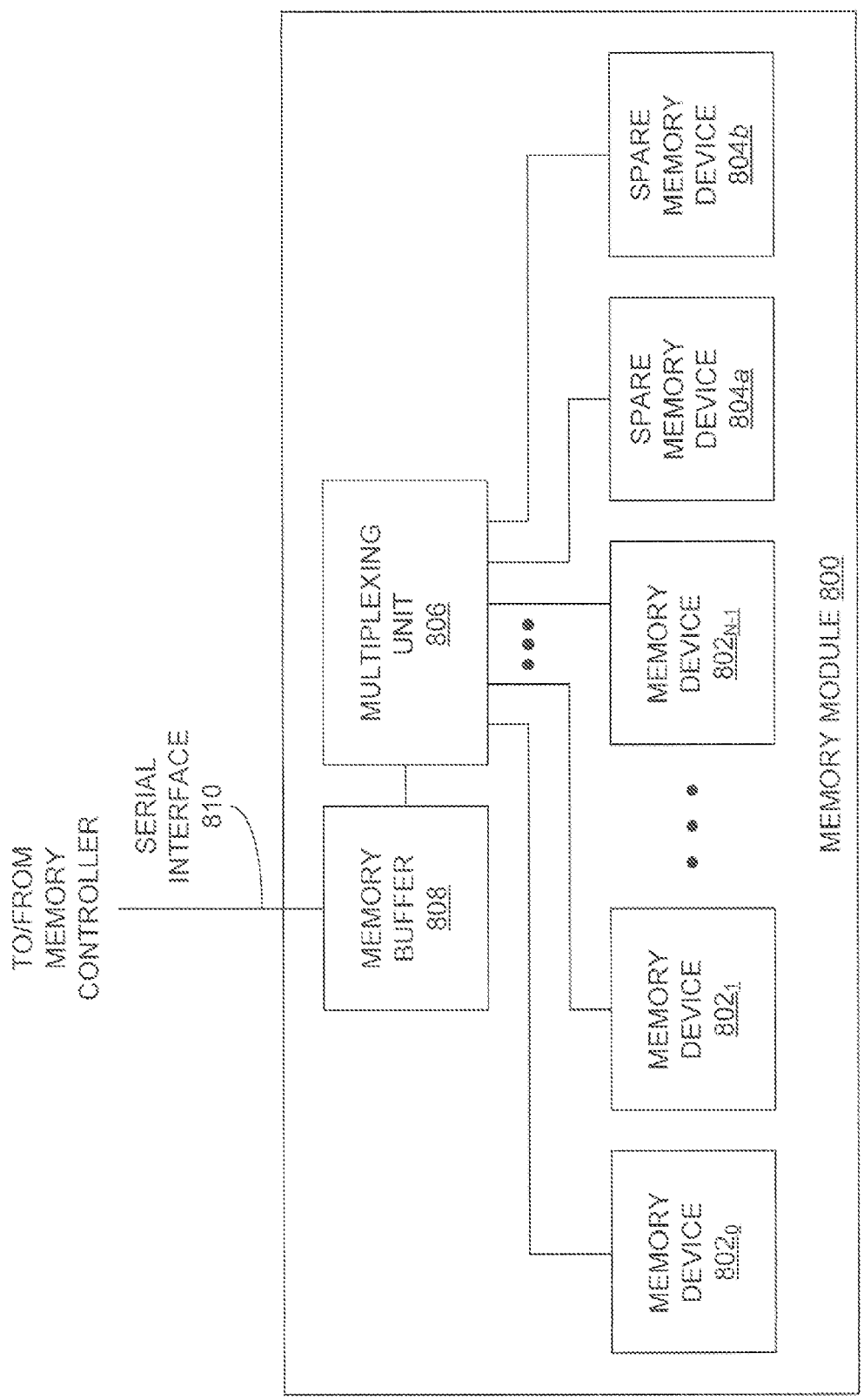
FIG. 8 is a block diagram of a memory module according to another embodiment of the invention in which two spare memory devices are provided within a single rank.
Figure 9:
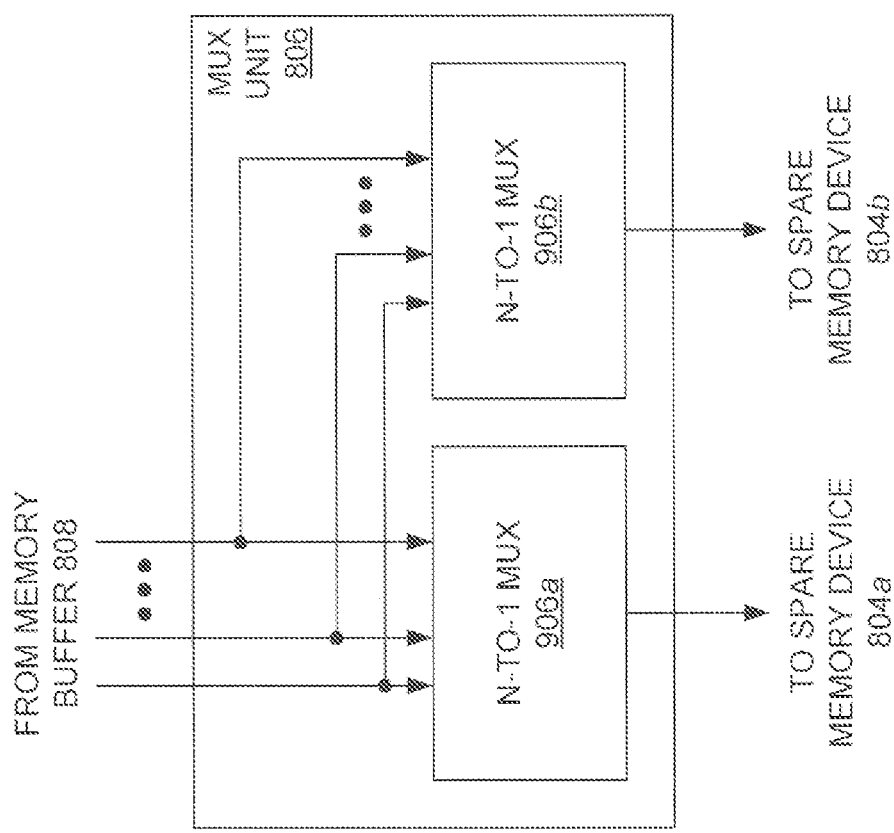
FIG. 9 is a block diagram of a portion of a multiplexing unit of the memory module of FIG. 8 for directing write data to the memory devices of the module according to an embodiment of the invention.
Figure 10:
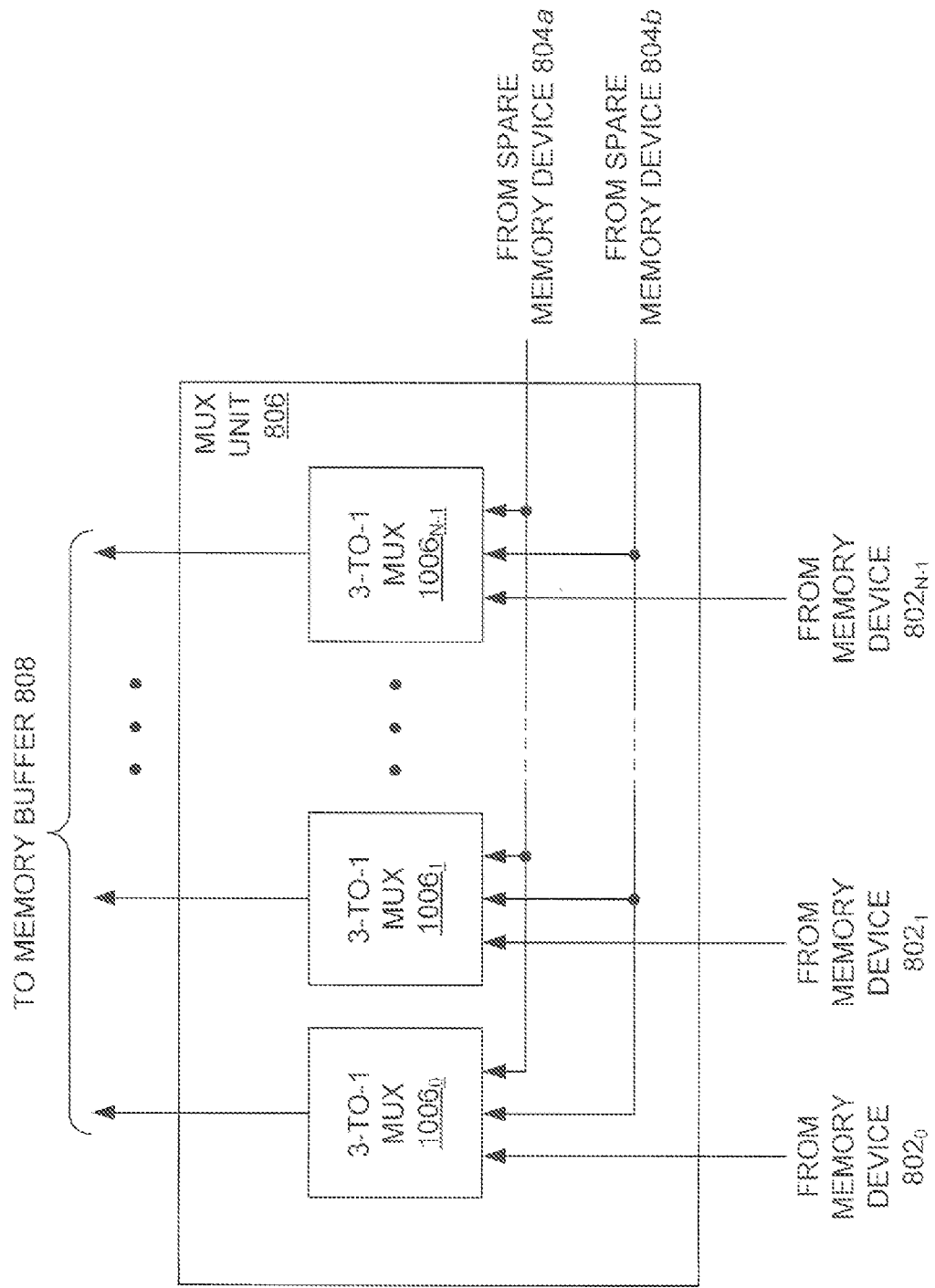
FIG. 10 is a block diagram of a portion of the multiplexing unit of the memory module of FIG. 8 for directing read data from the memory devices of the module according to an embodiment of the invention.

The embodiments described above focus upon supplying a single spare memory device for a rank of memory devices within a memory module. In other embodiments, more spare memory devices may be supplied within a single rank to allow the replacement of more defective memory devices within that rank. FIG. 8 provides an example of a single-rank memory module 800 possessing N memory devices $802_0$ to $802_{N-1}$ and two spare memory devices 804a, 804b. Similar to the memory module 100 of FIG. 1, a multiplexing unit 806 is coupled with the memory devices 802 and the two spare devices 804. In addition, a memory buffer 808 receives commands from a memory controller over a serial interface 810 for access to the memory devices 802, and directs the multiplexer 806 to replace one or two of the memory devices 802 with the spare memory devices 804. In one embodiment, the multiplexing unit 806 may include separate write and read multiplexers (not shown in FIG. 8), similar to the write multiplexer 306a and the read multiplexer 306b of FIG. 3. Given that two spare memory devices 804 are available, the multiplexing unit 806 may be required to direct write data intended to any one of the memory devices 802 to either of the spare memory devices 804. In one embodiment shown in FIG. 9, two separate write multiplexers 906a, 906b may be used within the multiplexing unit 806, wherein each multiplexer 906 directs write data intended for any of the memory devices 802 to one of the spare memory devices 804. FIG. 10 shows one example of how N 3-to-1 multiplexers 1006, labeled $1006_0$ to $1006_{N-1}$, may be employed within the multiplexing unit 806 to direct read data from either of the spare memory devices 804 in place of data from any of the memory devices 802. In other embodiments, more spare memory devices may be employed, requiring progressively more complex multiplexing units to direct the write and read data appropriately.

As described above, various embodiments of the memory modules and methods of the present invention allow a memory controller to direct a module to replace a defective or failing memory device of the module with a spare device of the module, thus allowing the memory controller to recoup its entire error correction capacity to correct other memory errors once the replacement has occurred. In some embodiments, the amount of command overhead required of the memory controller to direct the memory module to perform the replacement may be relatively inconsequential. In addition, once all of the data stored within the defective memory device has been transferred to the spare memory device, and the replacement has been made permanent, the memory controller command overhead may be reduced to near zero.

While several embodiments of the invention have been discussed herein, other embodiments encompassed by the scope of the invention are possible. For example, while some embodiments of the invention are described above in reference to a DRAM-based FB-DIMM memory module architecture, other memory devices and module structures may employ various aspects of the invention to significant advantage. For example, DIMMs of multiple ranks or SIMMs, each of which may employ DRAMs or SRAMs of varying types, may benefit from at least some embodiments of the invention. Also, aspects of one embodiment may be combined with those of alternative embodiments to create further implementations of the present invention. Thus, while the present invention has been described in the context of specific embodiments, such descriptions are provided for illustration and not limitation. Accordingly, the proper scope of the present invention is delimited only by the following claims.

What is claimed is:

1. A memory module, comprising:
   a printed circuit board (PCB);
   memory devices mounted on the PCB, wherein each of the memory devices comprises an integrated circuit chip;
   a first spare memory device mounted on the PCB, wherein the first spare memory device comprises an integrated circuit chip;
   a multiplexing unit mounted on the PCB coupled with each of the memory devices and the first spare memory device and
   a memory buffer mounted on the PCB coupled with the multiplexing unit and comprising a serial interface;
   wherein the memory buffer is configured to receive commands from a memory controller over the serial interface, process the commands, provide the memory controller access to the memory devices through the multiplexing unit in response to the commands, and, in response to at least one of the commands, direct the multiplexing unit to couple the first spare memory device to the memory buffer in place of one of the memory devices for at least a next access of the memory devices.

2. The memory module of claim 1, wherein the multiplexing unit is configured to couple the first spare memory device to the memory buffer in response to the at least one of the commands to cause memory accesses intended for one of the memory devices to be redirected and processed using the first spare memory device.

3. The memory module of claim 1, wherein the multiplexing unit is configured to couple the first spare memory device to the memory buffer in response to the at least one of the commands indefinitely.

4. The memory module of claim 1 where the memory controller is configured to detect a number of data errors that occur for a selected memory device from the memory devices and if the number of data errors is high, the memory controller is configured to transmit a command that directs the multiplexing unit to couple the first spare memory device to the memory buffer in place of the selected memory device before the selected memory device fails.

5. The memory module of claim 1, wherein the memory buffer comprises the multiplexing unit.

6. The memory module of claim 1, wherein the multiplexing unit comprises:
   a first multiplexer and a second multiplexer;
   wherein the first multiplexer is configured to couple the first spare memory device to the memory buffer in place of the one of the memory devices for read operations, and the second multiplexer is configured to couple the first spare memory device to the memory buffer in place of the one of the memory devices for write operations.

7. The memory module of claim 1, wherein the memory devices and the first spare memory device each comprise a dynamic random access memory device.

8. The memory module of claim 1, wherein the memory buffer comprises an advanced memory buffer for a fully-buffered dual in-line memory module.

9. The memory module of claim 1, wherein:
   the memory module further comprises a second spare memory device mounted on the PCB, wherein the second spare memory device comprises an integrated circuit chip; and
   the memory buffer is further configured, in response to at least another one of the commands, to direct the multiplexing unit to couple the second spare memory device to the memory buffer in place of a second one of the memory devices.

10. The memory module of claim 1, wherein:
   the memory module further comprises:
      second memory devices mounted on the PCB, wherein each of the second memory devices comprises an integrated circuit chip;
      a second spare memory device mounted on the PCB, wherein the second spare memory device comprises an integrated circuit chip; and
      a second multiplexing unit mounted on the PCB and coupled with each of the second memory devices and the second spare memory device;
   the memory buffer is coupled with the second multiplexing unit; and
   the memory buffer is further configured, in response to at least another one of the commands, to direct the second multiplexing unit to couple the second spare memory device to the memory buffer in place of one of the second memory devices.

11. A method for operating a memory buffer of a memory module, the method comprising:
  receiving serial commands from a memory controller;
  processing the serial commands;
  in response to processing the serial commands, providing the memory controller access to memory devices of the memory module through a multiplexing unit, wherein each of the memory devices is mounted on a printed circuit board (PCB) and each of the memory devices comprises an integrated circuit chip; and
  in response to at least one of the serial commands, directing the multiplexing unit to couple a first spare memory device of the memory module to the memory buffer in place of one of the memory devices for at least a next access of the memory devices, wherein the first spare memory device is mounted on the PCB and the first spare memory device comprises an integrated circuit chip.

12. The method of claim 11, wherein coupling the first spare memory device to the memory buffer in response to the at least one of the serial commands persists through at least the next access of the memory devices.

13. The method of claim 11, wherein coupling the first spare memory device to the memory buffer includes redirecting memory accesses intended for the one memory device to be processed using the first spare memory device.

14. The method of claim 11, wherein the memory buffer comprises the multiplexing unit.

15. The method of claim 11, wherein:
  the multiplexing unit comprises a first multiplexer and a second multiplexer; and
  directing the multiplexing unit to couple the first spare memory device to the memory buffer comprises directing the first multiplexer to couple the first spare memory device to the memory buffer in place of one of the memory devices for read operations, and directing the second multiplexer to couple the first spare memory device to the memory buffer in place of the one of the memory devices for write operations.

16. The method of claim 11, wherein the memory devices and the first spare memory device each comprise a dynamic random access memory device.

17. The method of claim 11, wherein the memory buffer comprises an advanced memory buffer for a fully-buffered dual in-line memory module.

18. The method of claim 11, wherein:
  the memory module further comprises a second spare memory device mounted on the PCB, wherein the second spare memory device comprises an integrated circuit chip; and
  the method further comprises, in response to at least another one of the commands, directing the multiplexing unit to couple the second spare memory device to the memory buffer in place of a second one of the memory devices.

19. The method of claim 11, wherein:
  the memory module further comprises:
    second memory devices mounted on the PCB, wherein each of the second memory devices comprise an integrated circuit chip;
    a second spare memory device mounted on the PCB, wherein the second spare memory devices comprises an integrated circuit chip; and
    a second multiplexing unit coupled with each of the second memory devices and the second spare memory device;
  the memory buffer is coupled with the second multiplexing unit; and
  the method further comprises, in response to at least another one of the commands, directing the second multiplexing unit to couple the second spare memory device to the memory buffer in place of one of the second memory devices.

20. A memory module, comprising:
  a printed circuit board (PCB);
  memory devices mounted on the PCB, wherein each of the memory devices comprises an integrated circuit chip;
  a first spare memory device mounted on the PCB, wherein each of the memory devices comprises an integrated circuit chip;
  a multiplexing unit coupled with each of the memory devices and the first spare memory device; and
  means for coupling the multiplexing with a memory controller, wherein the coupling means is configured to receive serial commands from the memory controller, process the serial commands, provide the memory controller access to the memory devices by way of the multiplexing unit in response to the serial commands, and, in response to at least one of the serial commands, direct the multiplexing unit to couple the first spare memory device to the memory buffer in place of one of the memory devices for at least a next access of the memory devices.

* * * * *